United States Patent
Sterling

(10) Patent No.: US 8,174,256 B2
(45) Date of Patent: May 8, 2012

(54) METHODS AND SYSTEMS FOR MAGNETIC FIELD SENSING

(75) Inventor: James William Sterling, Livonia, MI (US)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 12/129,962

(22) Filed: May 30, 2008

(65) Prior Publication Data
US 2009/0295382 A1 Dec. 3, 2009

(51) Int. Cl.
*G01R 33/09* (2006.01)
(52) U.S. Cl. .................. 324/207.21; 324/252
(58) Field of Classification Search .......... 324/173–174, 324/207.21, 207.25, 249, 251–252; 73/514.31, 73/514.39; 360/324–327, 313–316
See application file for complete search history.

(56) References Cited

U.S. PATENT DOCUMENTS

| | | | |
|---|---|---|---|
| 4,188,605 A | | 2/1980 | Stout |
| 4,496,303 A | | 1/1985 | Loubier |
| 4,785,242 A | * | 11/1988 | Vaidya et al. ............ 324/207.25 |
| 5,210,489 A | | 5/1993 | Petersen |
| 5,260,653 A | * | 11/1993 | Smith et al. .................. 324/252 |
| 5,781,005 A | * | 7/1998 | Vig et al. ................... 324/207.2 |
| 5,801,529 A | * | 9/1998 | Umemoto et al. ....... 324/207.12 |
| 5,888,416 A | | 3/1999 | Ikuma et al. |
| 5,936,400 A | * | 8/1999 | Tchertkov et al. ....... 324/207.21 |
| 5,963,028 A | | 10/1999 | Engel et al. |
| 6,063,322 A | | 5/2000 | Draxler et al. |
| 6,107,793 A | | 8/2000 | Yokotani et al. |
| 6,169,396 B1 | * | 1/2001 | Yokotani et al. ......... 324/207.21 |
| 6,265,865 B1 | | 7/2001 | Engel et al. |
| 6,278,270 B1 | * | 8/2001 | Robles-Flores et al. . 324/207.21 |
| 6,891,368 B2 | | 5/2005 | Kawano et al. |
| 6,949,386 B2 | | 9/2005 | Piguet et al. |
| 7,112,955 B2 | | 9/2006 | Buchhold |
| 7,250,760 B2 | | 7/2007 | Ao |
| 7,375,516 B2 | * | 5/2008 | Takenaga et al. ............. 324/252 |
| 7,382,122 B2 | * | 6/2008 | Komatsu et al. .............. 324/252 |
| 7,400,143 B2 | * | 7/2008 | Hayashi et al. ............... 324/252 |
| 7,548,060 B2 | * | 6/2009 | Herrmann et al. ............ 324/252 |
| 2003/0222642 A1 | * | 12/2003 | Butzmann ................ 324/207.21 |
| 2004/0174164 A1 | | 9/2004 | Ao |
| 2005/0146052 A1 | | 7/2005 | Sakmoto et al. |
| 2005/0146323 A1 | * | 7/2005 | Kleinen et al. ........... 324/207.26 |
| 2006/0164388 A1 | * | 7/2006 | Akieda et al. ................. 345/156 |

(Continued)

FOREIGN PATENT DOCUMENTS
DE 10123513 A1 3/2003
(Continued)

OTHER PUBLICATIONS

Wikipedia, Permanent Magnets Information, 2011.*

(Continued)

*Primary Examiner* — Bot Ledynh
(74) *Attorney, Agent, or Firm* — Eschweiler & Associates, LLC

(57) ABSTRACT

One embodiment relates to a sensor. The sensor includes a first magnet having a first surface and a second magnet having a second surface. A differential sensing element extends alongside the first and second surfaces. The differential sensing element includes a first sensing element and a second sensing element. In addition, a layer of ferromagnetic or paramagnetic material runs between the first and second magnets and spaces the first and second magnets from one another. Other apparatuses and methods are also set forth.

19 Claims, 6 Drawing Sheets

U.S. PATENT DOCUMENTS

| | | | |
|---|---|---|---|
| 2006/0261801 A1 | 11/2006 | Busch | |
| 2006/0279280 A1* | 12/2006 | Minamitani et al. | 324/252 |
| 2007/0001664 A1 | 1/2007 | Steinbrink et al. | |
| 2007/0018642 A1 | 1/2007 | Ao | |
| 2007/0063693 A1 | 3/2007 | Modest | |
| 2007/0075705 A1 | 4/2007 | Kurumado | |
| 2007/0145972 A1 | 6/2007 | Auberger et al. | |
| 2007/0284684 A1 | 12/2007 | Naito et al. | |
| 2008/0116884 A1 | 5/2008 | Rettig et al. | |
| 2009/0243595 A1 | 10/2009 | Theuss et al. | |

FOREIGN PATENT DOCUMENTS

| | | |
|---|---|---|
| DE | 10 2004 063 539 A1 | 9/2005 |
| DE | 60207560 T2 | 8/2006 |
| EP | 0 357 200 A2 | 3/1990 |
| JP | 60223095 A | 4/1984 |
| JP | 63084176 A | 4/1988 |
| JP | 11087797 A | 3/1999 |
| JP | 2000292203 A | 10/2000 |
| JP | 2000298134 A | 10/2000 |
| JP | 2004294070 A | 10/2004 |

OTHER PUBLICATIONS

Hyperphysics, Permanent Magnets Information, 2011.*

Hung, et al., "Effects of Additives on the Orientation and Strength of Plastic Ferrite Magnet", IEEE Transaction Magn., vol. 25, No. 5, Sep. 1989, p. 3287-3289.

Office Action dated Sep. 14, 2010 in connection with U.S. Appl. No. 11/950,050.

Office Action dated Apr. 20, 2010 in connection with U.S. Appl. No. 11/950,050.

U.S. Appl. No. 11/950,050 filed with the USPTO on Dec. 4, 2007.

U.S. Appl. No. 12/130,571 Filed with the USPTO on May 30, 2008.

R.S. Popovic, et al., "Integrated Hall-effect Magnetic Sensors", Department of Microengineering, EPFL, Swiss Federal Institute of Technology, CH-1015 Lausanne, Switzerland, 6 pages, 2001.

R. S. Popovic, "Not-plate-like Hall Magnetic Sensors and Their Applications" Swiss Federal Institute of Technology Lausanne, Room INR 137, CH-1015 Lausanne EPFL, Switzerland, 10 Pages, 2000.

Paul Leroy, et al., "Optimization of the Shape of Magnetic Field Concentrators to Improve the Sensitivity of Hall Sensors", Technisches Messen 73 (2006), 12 Pages.

Office Action Dated Apr. 11, 2011 for U.S. Appl. No. 12/130,571. 27 Pages.

Non-Final Office Action Dated Jun. 22, 2011 for U.S. Appl. No. 11/950,050. 38 Pages.

English machine translation of the detailed description of JP 11-087797 A. Obtained on Jul. 11, 2011 from the JPO website.

Notice of Allowance Dated Jul. 29, 2011 for U.S. Appl. No. 12/130,571. 20 Pages.

Final Office Action Dated Dec. 22, 2011 for U.S. Appl. No. 11/950,050. 45 pages.

* cited by examiner

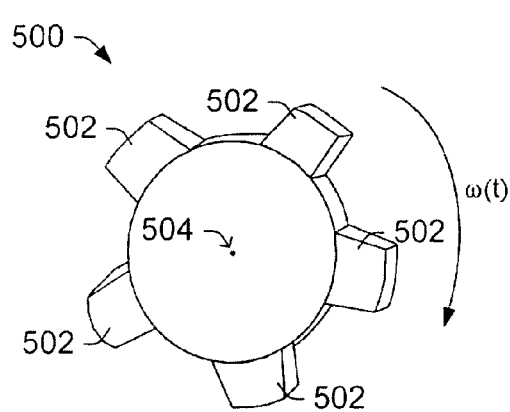
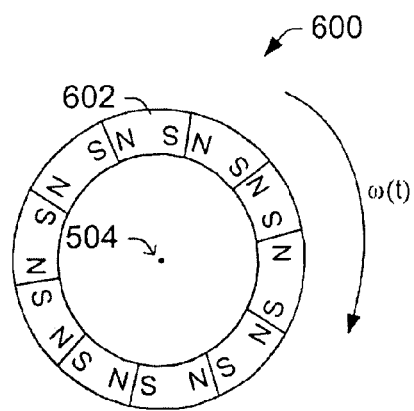
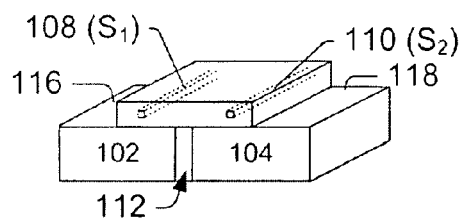
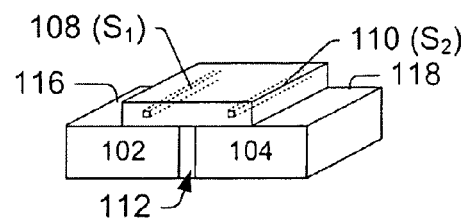
FIG. 5
FIG. 6
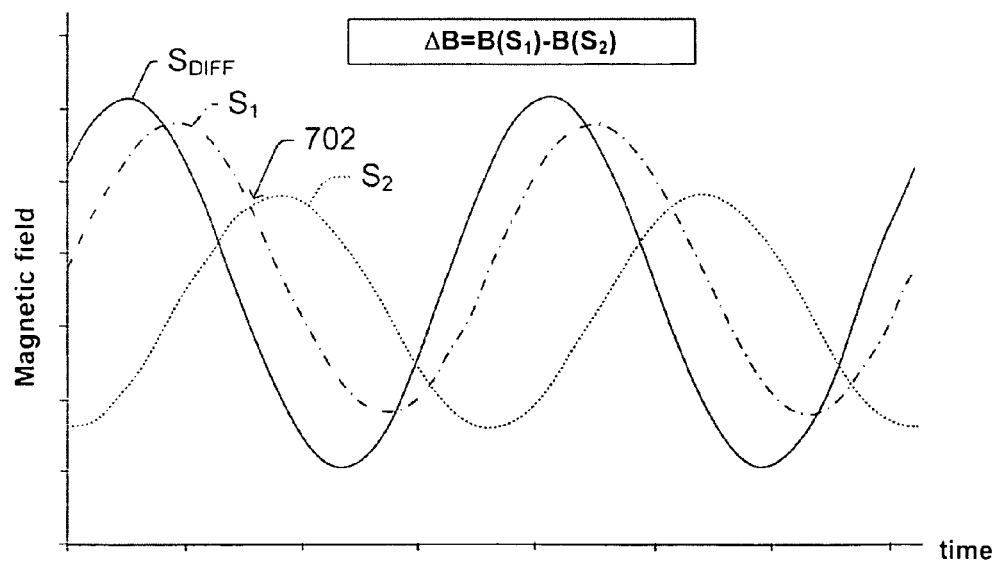
FIG. 7

METHODS AND SYSTEMS FOR MAGNETIC FIELD SENSING

FIELD OF INVENTION

The present invention relates to methods and systems for magnetic field sensing.

BACKGROUND

In many applications, it is useful to detect changes in magnetic field to track translational motion, rotational motion, proximity, speed and the like. Accordingly, magnetic field sensors are used in a wide variety of applications to detect subtle (or drastic) changes in magnetic field.

Magnetic field sensors are often used in large scale industrial applications, such as in automobiles. For example, magnetic field sensors are often used to detect the angle of a crankshaft or camshaft, and can also be used to measure tire speed rotation and a host of other conditions. Magnetic field sensors are also used in small-scale devices, such as computers. For example, magneto resistive sensors are currently the leading technology used for read heads in computer hard disks. Due to the wide range of applications, improvements in magnetic field sensors are a valuable contribution to the marketplace.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

One embodiment relates to a sensor. The sensor includes a first magnet having a first surface and a second magnet having a second surface. A differential sensing element extends alongside the first and second surfaces. The differential sensing element includes a first sensing element and a second sensing element. In addition, a layer of ferromagnetic or paramagnetic material runs between the first and second magnets and spaces the first and second magnets from one another. Other apparatuses and methods are also set forth.

The following description and annexed drawings set forth in detail certain illustrative aspects and implementations of the invention. These are indicative of but a few of the various ways in which the principles of the invention may be employed.

DRAWINGS

FIGS. 5-7 depicts magnetic field sensors during operation with a tooth-wheel and tone-wheel;

DETAILED DESCRIPTION

Figure 1:
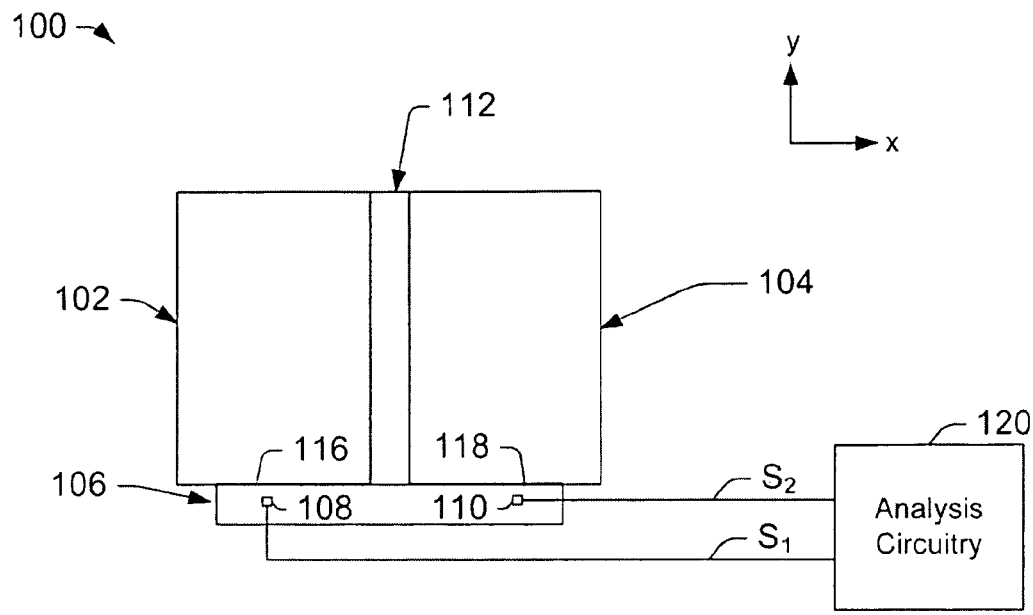
FIG. 1 depicts a magnetic field sensor in accordance with one embodiment.

The present invention will now be described with reference to the drawings wherein like reference numerals are used to refer to like elements throughout, and wherein the illustrated structures are not necessarily drawn to scale.

FIG. 1 shows one embodiment of a magnetic field sensor 100 that includes a first magnet 102 and a second magnet 104. A differential sensing element 106, which includes a first sensing element 108 and a second sensing element 110, is positioned under first and second surfaces 116, 118, respectively associated with the first and second magnets 102, 104. A field accumulator 112, which can be realized as a layer of ferromagnetic or paramagnetic material in some embodiments, separates the first magnet 102 from the second magnet 104.

During operation, the first and second sensing elements 108, 110 provide output signals $S_1$, $S_2$ to analysis circuitry 120. These output signals $S_1$, $S_2$ are indicative of the magnetic field detected by the sensing elements. By comparing the output signals $S_1$, $S_2$, the analysis circuitry 120 can determine information about the object to be detected (e.g., speed, proximity, shape, composition, position, or rotation information related to the object.)

In some embodiments, the first and second sensing elements 108, 110 are magneto resistive sensors, such as anisotropic magneto resistive (AMR) sensors or giant magneto resistive (GMR) sensors. Magneto resistance is the property of a material to change its electrical resistance as a function of a magnetic field applied to it. Thus, magneto resistive sensors provide a resistance that varies in a predictable manner as a function of magnetic field. When the first and second sensing elements 108, 110 comprise magneto resistive sensors, the sensors are sensitive to x-component changes in magnetic field.

Figure 1A:
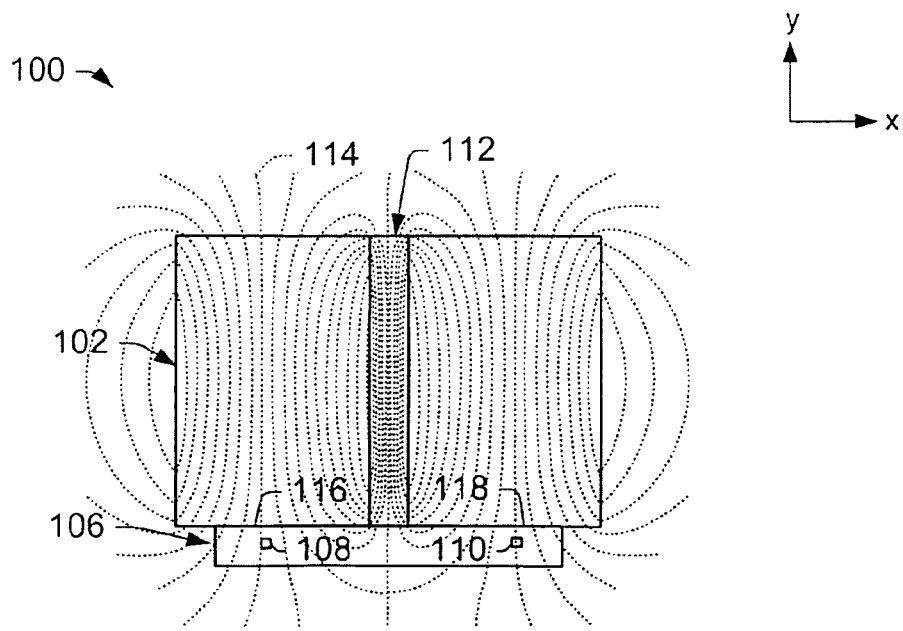
FIG. 1A depicts the magnetic field sensor of FIG. 1 with magnetic field lines superimposed thereon.

FIG. 1A shows magnetic field lines 114 in the absence of an object to be detected. Under this condition, the field accumulator 112 perpendicularly guides the magnetic field lines 114 from the magnets' first and second surfaces 116, 118, respectively through the first and second sensing elements 108, 110, respectively, thereby putting the magneto resistive sensors into an unsaturated, magnetically neutral state. When an object to be detected passes nearby one of the magneto resistive sensors (not shown), the magnetic field lines respond by altering their orientation from the un-saturating y-axis to the saturating x-axis, thereby putting the magneto resistive sensor into a saturated high or low resistive state, depending on the negative or positive component of the x-axis input. In this manner, the first and second sensing elements 108, 110 continuously track magnetic field changes (i.e., resistance changes) and provide output signals $S_1$, $S_2$ to the analysis circuitry 120.

Figure 2:
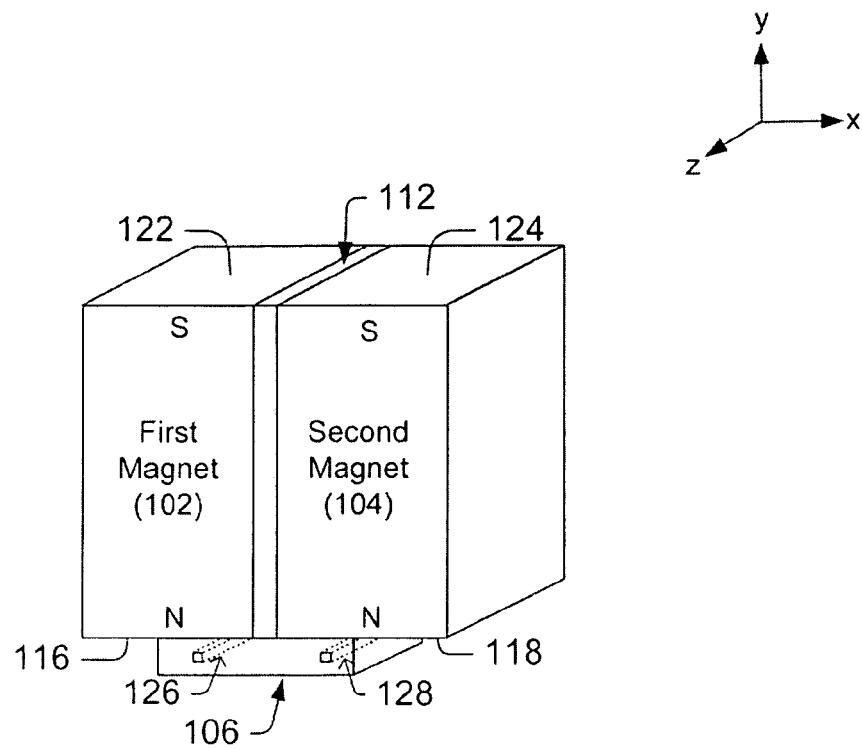
FIG. 2 depicts a three-dimensional depiction of a magnetic field sensor in accordance with one embodiment.
Figure 3:
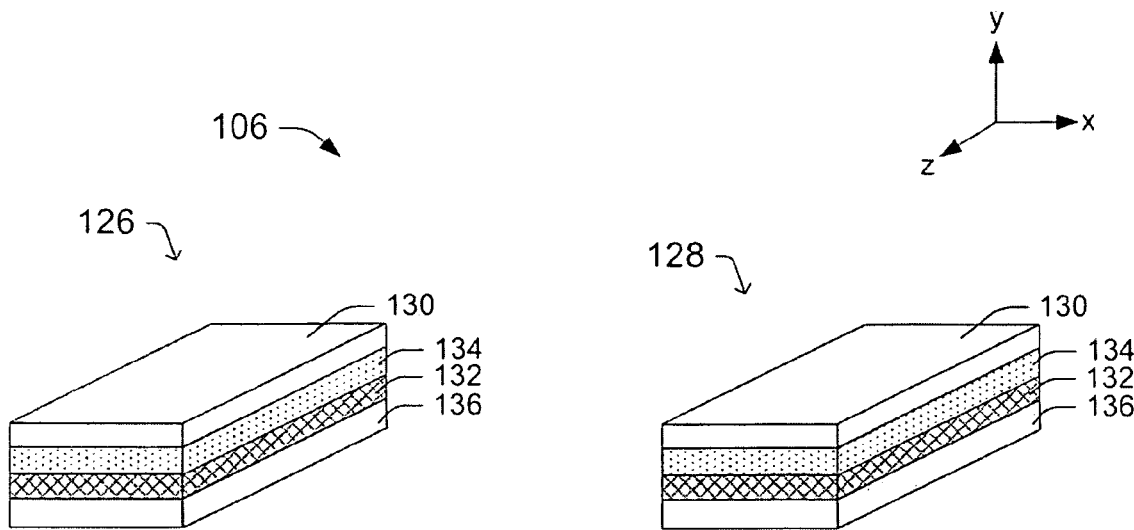
FIG. 3 depicts a three-dimensional depiction of a differential sensing element that include a pair of giant magneto resistance (GMR) sensing elements.

Referring now to FIG. 2-3, one can see one embodiment of a three-dimensional depiction of the magnetic field sensor 100. As shown, the first magnet 102 includes a first surface 116 associated with a magnetic pole of a first magnetic polarity (e.g., north (N)) and a third surface 122 associated with a magnetic pole of a second magnetic polarity (e.g., south (S)). Similarly, the second magnet 104 includes a second surface 118 associated with a magnetic pole of the first magnetic polarity (e.g., N) and a fourth surface 124 associated with a magnetic pole of the second magnetic polarity (e.g., S).

In the illustrated embodiment, the differential sensing element 106 includes a first GMR sensor 126 and a second GMR sensor 128. The first and second GMR sensors 126, 128 are sensitive to x-component changes in magnetic field.

FIG. 3 shows the first and second GMR sensors 126, 128 in more detail. The first and second GMR sensors 126, 128 include a first ferromagnetic layer 130 and a second ferromagnetic layer 132, which are separated from one another by a non-magnetic layer 134. An anti-ferromagnetic layer 136 is also included each GMR sensor. In other embodiments, additional alternating ferromagnetic and non-magnetic layers could also be added.

In one embodiment the first ferromagnetic layer 130 (which may also be referred to as a free layer) and the second ferromagnetic layer 132 (which may also be referred to as a pinned layer) can comprise a layer of ferromagnetic material having a thickness ranging from about 0.6 µm to about 5.0 µm. In some embodiments, the ferromagnetic material could comprise: CoFe, AuFe, or AlFe. The non-magnetic layer 134, which may also be referred to as a spacer layer, can have a thickness ranging from about 0.4 µm to about 3.0 µm; and can comprise Ru, Au, or Cu. The anti-ferromagnetic layer can comprise PtMn, FeMn, or $URu_2Si_2$. As will be appreciated by one of ordinary skill in the art, however, these layers could have other thicknesses and could be made of other materials in other embodiments.

In the absence of an object to be detected, the field accumulator 112 axially perpendicularly guides the magnetic field lines from the first and second surfaces 116, 118 into the first and second GMR sensors 126, 128, respectively. Thus, under this condition, the axially perpendicular magnetic field has no impact on the direction of magnetization of the free layer 130 and pinned layer 132 due to a weak anti-ferromagnetic coupling between them—this causes a median (neither high nor low) resistance. When an object to be detected comes in close proximity to the GMR sensors, however, the magnetization of the free layer 130 either aligns in a parallel or anti-parallel manner to the pinned layer 132 creating a low or high resistance respectively.

Figure 4:
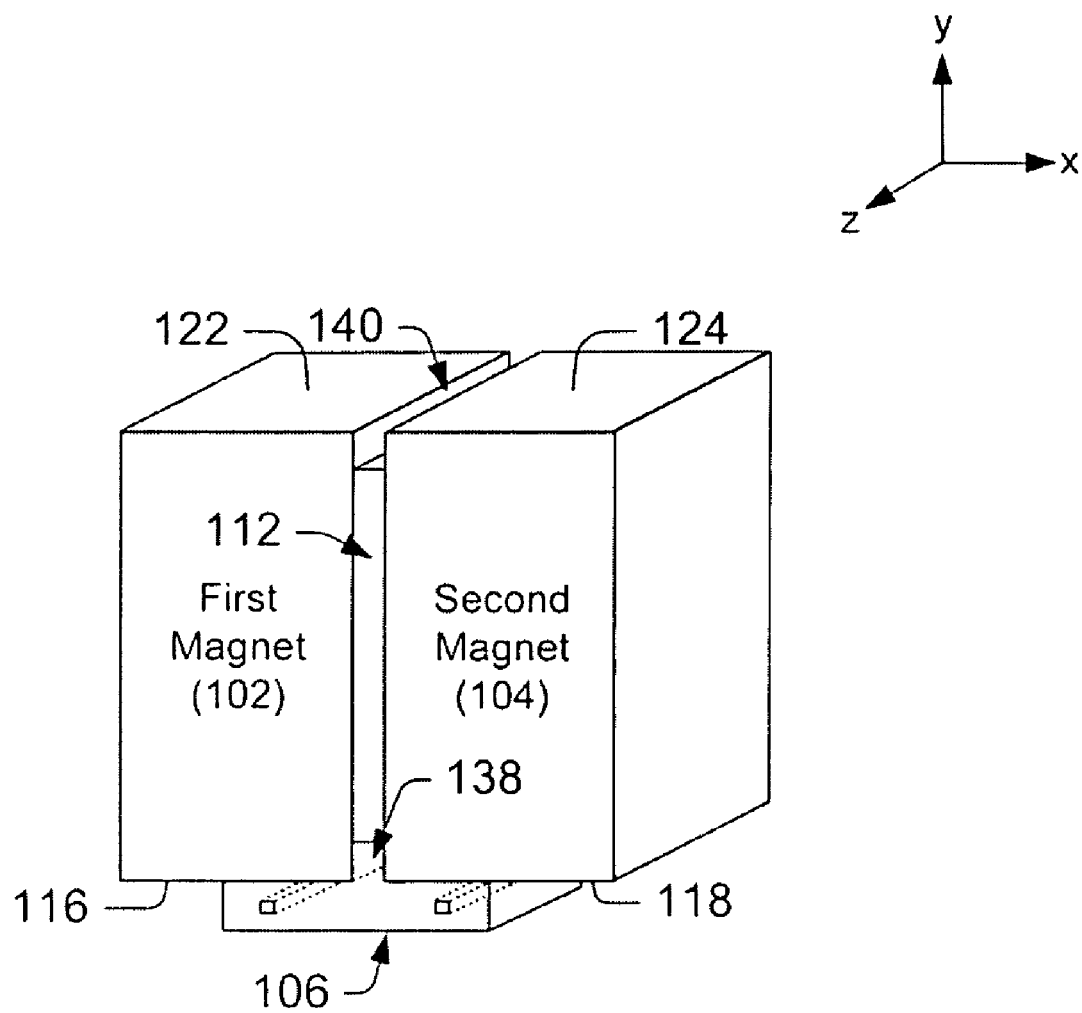
FIG. 4 depicts another embodiment of a three-dimensional depiction of a magnetic field sensor.

While FIGS. 2-3 show one embodiment of a three-dimensional sensor in the context of GMR sensors, alterations and/or modifications may be made to this embodiment without departing from the spirit and scope of the appended claims. For example, FIG. 4 shows another embodiment where the field accumulator 112 is characterized by a recess 138 relative to the first and second surfaces 116, 118; and a recess 140 relative to the third and fourth surfaces 122, 124. These recesses 138, 140 may provide somewhat improved perpendicular guidance of the magnetic field lines, depending on the materials used in the magnetic field sensor 100.

In other un-illustrated embodiments more complex geometries could also be used for the magnets, field accumulator, and sensing elements. For example, although the first and second magnets 102, 104, field accumulator 112, and differential sensing element 106 are illustrated as cube-like structures, in other embodiments these structures could be other polyhedral structures having any number of flat faces and straight edges. Further, in still other embodiments these structures could have curved faces and/or curved edges, and could be irregularly shaped. Although all such structures are contemplated as falling within the scope of the present disclosure, the illustrated cube-like structures may be advantageous in that the first and second magnets 102, 104 can be easily manufactured and do not need to be machined to complex shapes. This potentially reduces costs and improves manufacturing yields. In addition, although the field accumulator is shown as a single continuous layer, in other embodiments it could comprise multiple layers with the same or different compositions.

Referring now to FIGS. 5-7, one can see some two examples of how the magnetic field sensor 100 can be used. FIG. 5, for example, shows an embodiment of a tooth-wheel 500 that includes ferromagnetic or paramagnetic teeth 502 which rotate about a central axis 504. As the teeth rotate, the magnetic field lines from the first and second magnets 102, 104 change correspondingly. Because the first and second sensing elements 108, 110 are spaced apart by some distance, the magnetic fields at the first and second sensors 108, 110 are phase shifted relative to one another.

FIG. 7 shows signals $S_1$, $S_2$ as provided by the sensing elements 108, 110, respectively. Thus, assuming the first and second sensing elements 108, 110 are perfectly matched (which need not be the case), when a tooth 502 is equidistant between the first and second sensing elements 108, 110 the signals $S_1$ and $S_2$ should be equal (i.e., the magnetic field measured by sensing elements is equal). This corresponds to point 702 in FIG. 7, where the magnitude of $S_1$ is equal to the magnitude of $S_2$. As the tooth 502 proceeds along its radial path in time, one of the signals (e.g., $S_2$) will increase while the other signal (e.g., $S_2$) decreases. The analysis circuitry associated with the magnetic field sensor can compare these two signals to obtain the differential signal $S_{diff}$.

Because the differential signal $S_{diff}$ is obtained by comparing two signals, it efficiently ignores magnetic field variations due to unwanted influences. For example, the Earth's magnetic field could change slightly over time. However, because the first and second sensing elements 108, 110 would both experience this slight change in a similar manner (e.g., would be both be level shifted by the same amount), the differential signal $S_{diff}$ would still accurately represent the change in magnetic field due to only the tooth-wheel 500. The same discussion holds true for the tone-wheel in FIG. 6, which shows magnets 602 positioned around an outer perimeter of the tone-wheel 600.

Now that several examples of several magnetic field sensors and systems have been discussed, a method is now described with reference to FIG. 8. The analysis circuitry and magnetic field sensor include suitable circuitry, state machines, firmware, software, logic, etc. to perform this method 800 as well as other functions illustrated and described herein. While the methods illustrated and described herein are illustrated and described as a series of signal patterns, acts, or events, it will be appreciated that the present invention is not limited by the illustrated ordering of such acts, or events. For example, some acts may occur in different orders and/or concurrently with other acts or events apart from those illustrated and/or described herein, in accordance with the invention. In addition, not all illustrated steps may be required to implement a methodology in accordance with the present invention.

Figure 8:
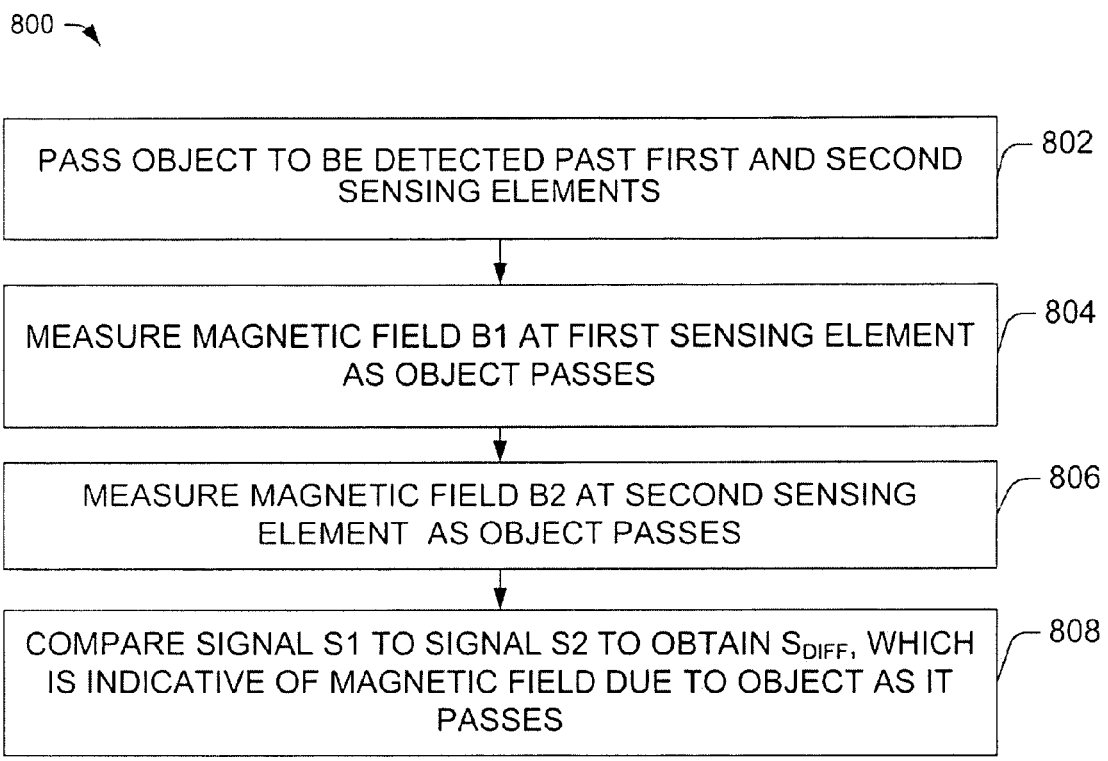
FIG. 8 is a flowchart showing one embodiment of a method of sensor operation.

Referring now to FIG. 8, one can see that method 800 starts at 802, where an object to be detected is passed by first and second sensing elements.

In 804, the first sensing element continuously or intermittently measures the magnetic field as the object passes by. The first sensing element returns a signal $S_1$ that is indicative of the time-varying magnetic field it experiences.

In 806, the second sensing element continuously or intermittently measures the magnetic field as the object passes by. The second sensing element returns a signal $S_2$ that is indicative of the time-varying magnetic field it experiences.

In 808, the signals $S_1$ and $S_2$ are compared to obtain a differential signal $S_{diff}$, which can be analyzed to determine information about the object, such as translational motion, rotational motion, speed, shape, proximity, and/or composition associated with the object.

While both AMR and GMR sensors can be used to monitor magnetic fields, these typically sensors differ in the amount by which change in resistance corresponds to change in magnetic field. For example, AMR sensors typically exhibit a change in resistance of about 3-5%, while GMR sensors typically exhibit a change in resistance of about 6-10%. In addition, it will be appreciated that other types of sensors could be used based on tradeoffs between cost, performance, and other customer requirements. For example, in other embodiments, Hall sensors could be used for the first and second sensing elements 108, 110.

Figure 9:
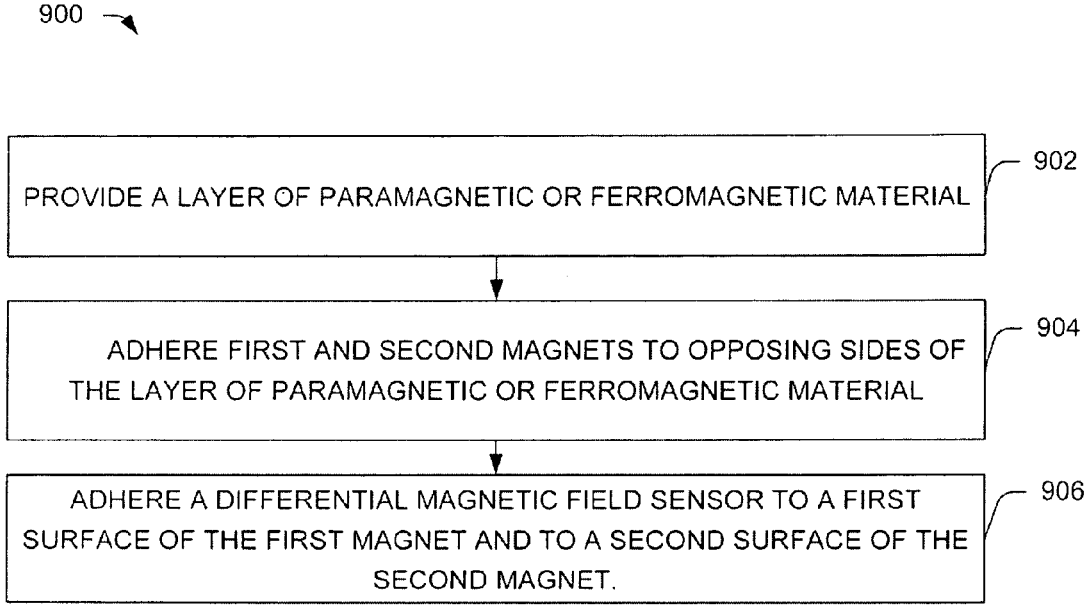
FIG. 9 is a flowchart showing one embodiment of a method of sensor manufacture.

FIG. 9 shows a method of manufacturing a magnetic field sensor in accordance with another embodiment. Again, these acts may be carried out in different orders than illustrated, and some acts may be carried out concurrently or may comprise multiple sub-acts. At 902, a layer of paramagnetic or ferromagnetic material is provided. At 904, first and second magnets are adhered to opposing sides of the layer of paramagnetic or ferromagnetic material. Because the field accumulator 112 causes the magnets 102 and 104 to attract one another (in spite of the poles tending to repel one another in the absence of the field accumulator), the field accumulator and magnets could be assembled without the use of epoxy in some embodiments. In other embodiments, however, it is advantageous to wait until later in the manufacturing process to magnetize the magnets, and in these embodiment epoxy or some other adhesive could be used to adhere the magnets to the field accumulator. In 906, a differential magnetic field sensor is adhered to a first surface of the first magnet and a second surface of the second magnet. Analysis circuitry may be integrated along with any of these various components, or may be separated connected to the assembled sensor.

In regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A magnetic field sensor, comprising:
    a first magnet comprising a first surface;
    a second magnet comprising a second surface, wherein the first and second surfaces are oriented in the same direction;
    a differential sensing element extending alongside the first and second surfaces, where the differential sensing element includes: a first sensing element disposed directly over the first surface, and a second sensing element spaced apart from the first sensing element and disposed directly over the second surface; and
    a layer of ferromagnetic or paramagnetic material running between the first and second magnets and spacing the first and second magnets from one another, wherein the layer of ferromagnetic or paramagnetic material does not have a sensing element disposed directly over a surface thereof, and
    wherein the first and second surfaces are associated with magnetic poles having a common polarity.

2. The magnetic field sensor of claim 1, where the layer of ferromagnetic or paramagnetic material is adapted to perpendicularly guide magnetic field lines from the first surface through the first sensing element, and is further adapted to perpendicularly guide magnetic field lines from the second surface through the second sensing element.

3. The magnetic field sensor of claim 1, where the first sensing element comprises a first magneto resistive sensor and where the second sensing element comprises a second magneto resistive sensor.

4. The magnetic field sensor of claim 3, where the layer of ferromagnetic or paramagnetic material is adapted to perpendicularly guide magnetic field lines from the first surface through the first magneto resistive sensor, and is further adapted to perpendicularly guide magnetic field lines from the second surface through the second magneto resistive sensor.

5. The magnetic field sensor of claim 3, where the first magneto resistive sensor comprises:
    a first ferromagnetic layer;
    a second ferromagnetic layer; and
    a non-magnetic layer sandwiched between the first and second ferromagnetic layers.

6. The magnetic field sensor of claim 3, where the first magneto resistive sensor comprises a giant magneto resistive (GMR) sensor.

7. A magnetic field sensor, comprising:
    a first magnet comprising a first surface associated with a magnetic pole of a first polarity;
    a second magnet comprising a second surface associated with a magnetic pole of the first polarity, wherein the first and second surfaces are oriented in the same direction, and wherein the first and second surfaces are associated with magnetic poles having a common polarity;
    a differential sensing element comprising: a first magnetic field sensing element disposed directly over the first surface, and a second magnetic field sensing element disposed over the second surface; and
    a field accumulator running between the first and second magnets and spacing the first and second magnets from one another, and adapted to perpendicularly guide magnetic field lines from the first and second surfaces through the first and second sensing elements, wherein the field accumulator does not have a magnetic field sensing element disposed directly over a surface thereof.

8. The magnetic field sensor of claim 7, where the first sensing element comprises a first giant magneto resistive sensor and where the second sensing element comprises a second giant magneto resistive sensor.

9. The magnetic field sensor of claim 8, where the first giant magneto resistive sensor comprises:
    a first ferromagnetic layer;
    a second ferromagnetic layer; and
    a non-ferromagnetic layer sandwiched between the first and second ferromagnetic layers.

10. The magnetic field sensor of claim 8, where the first magneto resistive sensor comprises a giant magneto resistive (GMR) sensor.

11. The magnetic field sensor of claim 8:
where the magnetic poles of the first and second magnets are substantially aligned on a y-axis; and
where the first and second magneto resistive sensors are substantially aligned on a z-axis.

12. The magnetic field sensor of claim 8, where the first and second magnets have a polyhedral shape.

13. The magnetic field sensor of claim 8, where the first and second magnets include curved surfaces or edges.

14. A method of making a magnetic field sensor, comprising:
providing a layer of paramagnetic or ferromagnetic material;
adhering first and second magnets to opposing sides of the layer of paramagnetic or ferromagnetic material, wherein during adhesion of the first and second magnets to the opposing side of the layer, the first and second magnets are arranged so the first and second surfaces are oriented in the same direction and are associated with magnetic poles having a common polarity;
adhering a first magnetic field sensor element directly over a first surface of the first magnet and a second magnetic field sensor element directly over a second surface of the second magnet, wherein a magnetic field sensor is not directly over a surface of the layer of paramagnetic or ferromagnetic material.

15. The method of claim 14, where the first magnetic field sensor element comprises a first magneto resistive sensor and where the second magnetic field sensor element comprises a second magneto resistive sensor.

16. The magnetic field sensor of claim 1, further comprising analysis circuitry configured to interface with the differential sensing element, and configured to calculate a difference between a signal obtained from the first sensing element and a signal obtained from the second sensing element.

17. The magnetic field sensor of claim 16, wherein the analysis circuitry is further configured to determine information about an object being sensed based on the calculated difference.

18. The magnetic field sensor of claim 7, further comprising analysis circuitry configured to interface with the differential sensing element, and configured to calculate a difference between a signal obtained from the first sensing element and a signal obtained from the second sensing element.

19. The magnetic field sensor of claim 18, wherein the analysis circuitry is further configured to determine information about an object being sensed based on the calculated difference.

\* \* \* \* \*